United States Patent
Callegari et al.

(10) Patent No.: US 7,611,979 B2
(45) Date of Patent: Nov. 3, 2009

(54) METAL GATES WITH LOW CHARGE TRAPPING AND ENHANCED DIELECTRIC RELIABILITY CHARACTERISTICS FOR HIGH-K GATE DIELECTRIC STACKS

(75) Inventors: Alessandro C. Callegari, Yorktown Heights, NY (US); Michael P. Chudzik, Danbury, CT (US); Barry P. Linder, Hastings-on-Hudson, NY (US); Renee T. Mo, Briarcliff Manor, NY (US); Vijay Narayanan, New York, NY (US); Dae-Gyu Park, Poughquag, NY (US); Vamsi K. Paruchuri, New York, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 11/673,901

(22) Filed: Feb. 12, 2007

(65) Prior Publication Data
US 2008/0191292 A1    Aug. 14, 2008

(51) Int. Cl.
*H01L 21/3205* (2006.01)
*H01L 21/28* (2006.01)

(52) U.S. Cl. ............... 438/588; 438/586; 438/605; 257/E21.621; 257/E21.639

(58) Field of Classification Search ............... 438/586, 438/588, 592, 605; 257/E21.621, E21.625, 257/E21.639
See application file for complete search history.

(56) References Cited

U.S. PATENT DOCUMENTS

| | | | |
|---|---|---|---|
| 5,565,702 A | 10/1996 | Tamura et al. | |
| 6,506,676 B2 * | 1/2003 | Park et al. | 438/683 |
| 6,798,026 B2 * | 9/2004 | Hu et al. | 257/388 |
| 7,023,055 B2 | 4/2006 | Ieong et al. | |
| 2001/0039107 A1 * | 11/2001 | Suguro | 438/585 |
| 2002/0050644 A1 | 5/2002 | Matsumoto et al. | |
| 2002/0179975 A1 | 12/2002 | Wakabayashi et al. | |

(Continued)

OTHER PUBLICATIONS

Krishnan et al., Charge Trapping Dependence on the Physical Structure of Ultra-thin ALD-HfSiON/TiN Gate Stacks, IIRW Final Report, IEEE, 2005, pp. 89-90.

(Continued)

*Primary Examiner*—Alexander G Ghyka
*Assistant Examiner*—Seahvosh J Nikmanesh
(74) *Attorney, Agent, or Firm*—Scully, Scott, Murphy & Presser, P.C.; Vazken Alexanian (57) ABSTRACT

A multilayered gate stack having improved reliability (i.e., low charge trapping and gate leakage degradation) is provided. The inventive multilayered gate stack includes, from bottom to top, a metal nitrogen-containing layer located on a surface of a high-k gate dielectric and Si-containing conductor located directly on a surface of the metal nitrogen-containing layer. The improved reliability is achieved by utilizing a metal nitrogen-containing layer having a compositional ratio of metal to nitrogen of less than 1.1. The inventive gate stack can be useful as an element of a complementary metal oxide semiconductor (CMOS). The present invention also provides a method of fabricating such a gate stack in which the process conditions of a sputtering process are varied to control the ratio of metal and nitrogen within the sputter deposited layer.

6 Claims, 4 Drawing Sheets

U.S. PATENT DOCUMENTS

| | | |
|---|---|---|
| 2003/0027393 A1 | 2/2003 | Suguro |
| 2003/0211713 A1 | 11/2003 | Suguro et al. |
| 2004/0104439 A1 | 6/2004 | Haukka et al. |
| 2004/0256700 A1 | 12/2004 | Doris et al. |
| 2005/0059198 A1 | 3/2005 | Visokay et al. |
| 2005/0116290 A1 | 6/2005 | de Souza et al. |
| 2005/0205947 A1 | 9/2005 | Yu et al. |
| 2005/0282341 A1 | 12/2005 | Park et al. |
| 2006/0151846 A1 | 7/2006 | Callegari et al. |
| 2006/0270204 A1 * | 11/2006 | Ku et al. .................... 438/592 |
| 2007/0023842 A1 | 2/2007 | Jung et al. |

OTHER PUBLICATIONS

Kim et al., Hard and Soft-Breakdown Characteristics of Ultra-Thin HfO2 Under Dynamic and Constant Voltage Stress, IEEE, 2002.

Zafar et al., Charge Trapping Related Threshold Voltage Instabilities in High Permittivity Gate Dielectric Stacks, Journal of Applied Physics, Jun. 1, 2003, pp. 9298-9303, vol. 93, No. 11.

Choi et al., Charge Trapping and Detrapping Characteristics in Hafnium Silicate Gate Stack Under Static and Dynamic Stress, IEEE Electron Device Letters, Mar. 2005, pp. 197-199, vol. 26, No. 3.

Wakabayashi, H., et al., "A Novel W/TINX Metal Gate CMOS Technology Using Nitrogen-Concentration-Controlled TINX Film," International Electron Devices Meeting 1999, IEDM, Technical Digest, Washington D.C., Dec. 5-8, 1999, pp. 253-256.

* cited by examiner

METAL GATES WITH LOW CHARGE TRAPPING AND ENHANCED DIELECTRIC RELIABILITY CHARACTERISTICS FOR HIGH-K GATE DIELECTRIC STACKS

FIELD OF THE INVENTION

The present invention relates to a semiconductor structure and a method of fabricating the same. More particularly, the present invention relates to a multilayered gate stack including a metal gate and a high-k gate dielectric, which gate stack is useful as an element of a complementary metal oxide semiconductor (CMOS) device. The multilayered gate stack of the present invention has improved reliability which is manifested by low charge trapping and gate leakage degradation. The present invention also relates to a method of fabricating such a multilayered gate stack utilizing processing steps that are compatible with existing CMOS technology.

BACKGROUND OF THE INVENTION

In standard CMOS devices, polysilicon is typically the standard gate material. The technology of fabricating CMOS devices using polysilicon gates has been in a constant state of development, and is now widely used in the semiconductor industry. One advantage of using polysilicon gates is that such silicon-based gates can sustain high temperatures. However, there are also some problems associated with using a polysilicon gate. For example, due to the poly-depletion effect and relative high electrical sheet resistance, polySi gates commonly used in CMOS devices are becoming a gating factor in chip performance for channel lengths of 0.1 micron and below. Another problem with polySi gates is that the dopant in the polySi gate, such as boron, can easily diffuse through the thin gate dielectric causing further degradation of the device performance.

In order to avoid the problems with polySi gates, it has been suggested to replace the polySi gate with a single metal. Although such technology has been suggested, single metals on a high-k (dielectric constant greater than about 4.0) layer have two important reliability issues that need to be considered. One of the reliability issues associated with a gate stack including a metal gate and a high-k gate dielectric is that of charge trapping induced threshold voltage (Vt) shifts. Another reliability issue of concern in such metal-containing gate stacks is gate leakage current degradation under prolonged electrical stressing.

Both charge trapping and gate leakage degradation impact the long term stability of the device and need to be reduced for the successful implementation of high-k/metal gate stacks in CMOS technology.

In view of the above, there is a need for providing a gate stack including a metal gate located on a high-k gate dielectric in which charge trapping and gate leakage degradation have been reduced.

SUMMARY OF THE INVENTION

Applicants have unexpectedly and quite surprisingly determined that the compositional ratio between the metal and nitrogen such as, Ti/N, of a metal nitride gate in a high-k gate stack significantly impacted the reliability characteristics, (i.e., both charge trapping and gate dielectric degradation). For a metal nitrogen ratio of less than 1.1, the reliability of the high-k gate stacks is significantly improved.

In particular, the present invention provides a multilayered gate stack having low charge trapping and gate dielectric degradation. By "low charge trapping", it is meant a semiconductor device in which the change in threshold voltage Vt is less than or equal to 50.0 millivolts at an applied voltage of about 8.5 megavolts/cm$^2$ at 1000 seconds. By "low gate leakage" it is meant a gate current that will not degrade with voltage stress, i.e., delta $J_g(t) J_g(O)$, of less than or equal to 1.0.

In general terms, the present invention provides a multilayered gate stack which includes, from bottom to top, a metal nitrogen-containing layer located on a surface of a high-k gate dielectric, said metal nitrogen-containing layer having a compositional ratio of metal to nitrogen of less than 1.1; and a Si-containing conductor located directly on a surface of said metal nitrogen-containing layer.

The metal of the metal nitrogen-containing layer is selected from Group IVB, VB, VIB or VIIB of the Periodic Table of Elements (CAS version). Typically, the metal nitrogen-containing layer is TiN.

In some embodiments of the present invention, an interfacial layer is located directly beneath the high-k gate dielectric. The term 'high-k' gate dielectric denotes a dielectric material having a dielectric constant (relative to vacuum) that is greater than 4.0. The term "interfacial layer" is used throughout the present application to denote an insulator material that comprises atoms of at least a semiconductor, such as Si, and O. $SiO_2$, and SiON are examples of different types of interfacial layers that can be employed in the present invention.

The multilayered gate stack described above is useful as a component of a CMOS structure. Specifically, and in this regard, the present invention provides a semiconductor structure that comprises:

a semiconductor structure; and at least one patterned multilayered gate stack located on a surface of said semiconductor structure, wherein said at least one patterned multilayered gate stack comprises, from bottom to top, a metal nitrogen-containing layer located on a surface of a high-k gate dielectric, said metal nitrogen-containing layer having a compositional ratio of metal to nitrogen of less than 1.1, and a Si-containing conductor located directly on a surface of said metal nitrogen-containing layer.

In some embodiments of the present invention, an interfacial layer is located directly beneath the high-k gate dielectric on a surface of said semiconductor structure. In yet another embodiment of the present invention, a silicide contact is located atop the Si-containing conductor. In still yet another embodiment of the present invention, the Si-containing conductor is n-doped. In an even further embodiment of the present invention, the Si-containing conductor is p-doped. The latter type doping is preferred in the present invention.

In addition to providing a multilayered gate stack structure for use as an element of a CMOS device, the present invention also provides a method of fabricating the same. In general terms, the method of the present invention, which is compatible with existing CMOS processing techniques, comprises:

forming a metal nitrogen-containing layer on a surface of a high-k gate dielectric, said metal nitrogen-containing layer having a compositional ratio of metal to nitrogen of less than 1.1; and a forming a Si-containing conductor located directly on a surface of said metal nitrogen-containing layer.

In some embodiments of the present invention, the high-k gate dielectric is disposed directly on a surface of an interfacial layer. In yet another embodiment of the present invention, the high-k gate dielectric is disposed directly on a surface of a semiconductor substrate. In still yet another embodiment of the present invention, at least the metal nitrogen-containing layer and Si-containing conductor are patterned by lithography and etching. In yet another embodiment, the patterned stack including at least the metal nitrogen-containing layer and the Si-containing conductor are used as an element in a CMOS device. In such an embodiment, a metal silicide contact can be formed atop the Si-containing conductor utilizing a conventional silicidation process that is self-aligned (i.e., a salicidation process).

DETAILED DESCRIPTION OF THE INVENTION

The present invention, which provides a multilayered gate stack including at least a metal gate and a high-k gate dielectric having low charge trapping and gate leakage degradation, as well as a method of fabricating the same, will now be described in greater detail by referring to the following discussion and drawings that accompany the present application. The drawings of the present invention, which are referred to in the present application, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a multilayered gate stack, which includes at least a metal gate located on a high-k gate dielectric, having low charge trapping and gate leakage degradation. By "low charge trapping", it is meant a semiconductor device in which the change in threshold voltage Vt is less than or equal to 50.0 millivolts at an applied voltage of about 8.5 megavolts/cm$^2$ at 1000 seconds. By "low gate leakage" it is meant a gate current that will not degrade with voltage stress, i.e., delta $J_g(t)/J_g(O)$, of less than or equal to 1.0.

Applicants have unexpectedly and quite surprisingly determined that the compositional ratio between the metal and nitrogen such as, Ti/N, in a metal nitride gate significantly impacted the reliability characteristics, i.e., both charge trapping and gate dielectric degradation, of high-k gate stacks. For a metal/nitrogen ratio of less than 1.1, the reliability of high-k gate stacks is significantly improved. In particular, the present invention provides a multilayered gate stack which includes, from bottom to top, a metal nitrogen-containing layer located on a surface of a high-k gate dielectric, said metal nitrogen-containing layer having a compositional ratio of metal to nitrogen of less than 1.1; and a Si-containing conductor located directly on a surface of the metal nitrogen-containing layer.

The metal of the metal nitrogen-containing layer is selected from Group IVB, VB, VIIB or VIIB of the Periodic Table of Elements (CAS version). Typically, the metal nitrogen-containing layer is TiN.

In some embodiments of the present invention, an interfacial layer is located directly beneath the high-k gate dielectric. The term 'high-k' gate dielectric denotes a dielectric material having a dielectric constant (relative to vacuum) that is greater than 4.0. The term "interfacial layer" is used throughout the present application to denote an insulator material that comprises atoms of at least a semiconductor, such as Si, and O. SiO$_2$, and SiON are examples of different types of interfacial layers that can be employed in the present invention.

The multilayered gate stack described above is useful as a component of a CMOS structure. Specifically, and in this regard, the present invention provides a semiconductor structure that comprises: a semiconductor structure; and at least one patterned multilayered gate stack located on a surface of said semiconductor structure, wherein said at least one patterned multilayered gate stack comprises, from bottom to top, a metal nitrogen-containing layer located on a surface of a high-k gate dielectric, said metal nitrogen-containing layer having a compositional ratio of metal to nitrogen of less than 1.1, and a Si-containing conductor located directly on a surface of said metal nitrogen-containing layer.

Figure 1:
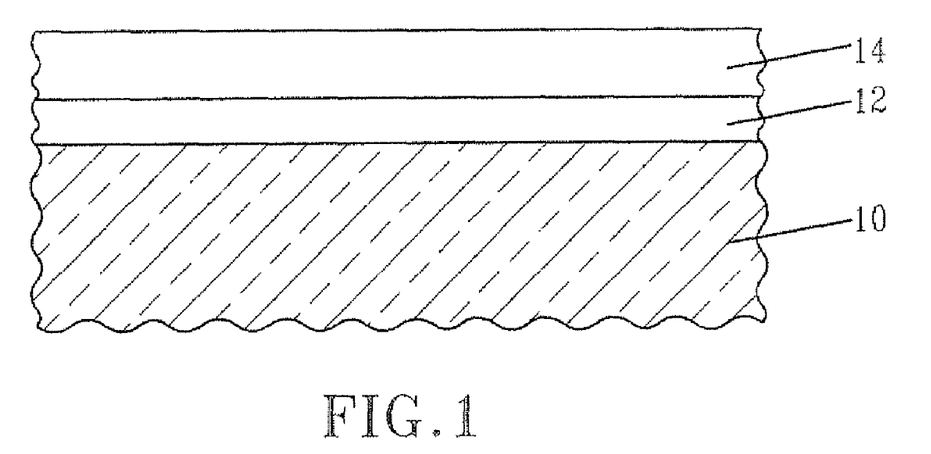
FIGS. 1-5 are pictorial representations (through cross sectional views) depicting the basic processing steps of the present invention.

These and other aspect of the present invention will now be described in greater detail. In particular, reference is now made to FIGS. 1-5, which are pictorial representations (through cross sectional views) depicting the basic processing steps of the present invention that are used in forming a CMOS device, e.g., a FET, on a surface of a semiconductor substrate. FIG. 1 shows an initial film stack structure that includes an optional, yet preferred, interfacial layer 12 on a surface of a semiconductor substrate 10 and a high-k gate dielectric 14 located on the optional interfacial layer 12. Although FIG. 1 depicts this film stack structure, the present invention also contemplates, as an initial film stack, one in which the high-k gate dielectric 14 is formed directly on the surface of the semiconductor substrate 10.

The semiconductor substrate 10 employed in the present invention comprises any semiconducting material including, but not limited to: Si, Ge, SiGe, SiC, SiGeC, Ga, GaAs, InAs, InP and all other IV/IV, III/V, or II/VI compound semiconductors. Semiconductor substrate 10 may also comprise an organic semiconductor or a layered semiconductor such as Si/SiGe or a semiconductor-on-insulator such as, for example, a silicon-on-insulator (SOI) or a SiGe-on-insulator (SGOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein.

The semiconductor substrate 10 may be strained, unstrained or a combination thereof. Moreover, the semiconductor substrate 10 may have any crystallographic orientation including, for example, {100}, {110}, {111} or a combination thereof. Alternatively, the semiconductor substrate 10 may be a hybrid substrate that includes at least two planar surfaces of different crystallographic orientation. The hybrid substrate can be formed by techniques such as described, for example, in U.S. Ser. No. 10/250,241, filed Jun. 17, 2003, now U.S. Publication No. 20040256700A1, U.S. Ser. No. 10/725,850, filed Dec. 2, 2003, now U.S. Publication No. 20050116290A1 and U.S. Ser. No. 10/696,634, filed Oct. 29, 2003, now U.S. Pat. No. 7,023,055 the entire contents of each are incorporated herein by reference.

The semiconductor substrate 10 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells".

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities. The neighboring gate regions can have the same conductivity (i.e., both n- or p-type), or alternatively they can have different conductivities (i.e., one n-type and the other p-type).

Interfacial layer 12 is then typically, but not necessarily always, formed atop the surface of the semiconductor substrate 10 utilizing a thermal process such as oxidation or oxynitridation, a deposition process such as chemical vapor deposition (CVD), plasma-assisted CVD, atomic layer deposition (ALD), evaporation, sputtering, and chemical solution deposition, or a combination thereof. Alternatively, a deposition process and nitridation can be used to form the interfacial layer 12.

The interfacial layer 12 is an insulator that comprises atoms of at least a semiconductor such as, for example, Si, and O, with N being optional. The interfacial layer 12 thus may comprise $SiO_2$, SiON, silicates thereof, or multilayers thereof. In some embodiments, the interfacial layer 12 comprises $SiO_2$, while in other embodiments the interfacial layer 12 comprises SiON. The interfacial layer 12 comprises from about 1 to about 80, typically from about 1 to about 20, atomic percent Si. The remaining is O and/or N. A chemical oxide is typically used with no N present. The Si can be continuously present throughout the interfacial layer 12 or it can be graded.

The interfacial layer 12 typically has a dielectric constant from about 4.0 to about 20, with a dielectric constant from about 4.5 to about 18 being even more typical. The interfacial layer 12 typically has a thickness from about 0.1 to about 5 nm, with a thickness from about 0.2 to about 2.5 nm being more typical.

In an embodiment of the present invention, the interfacial layer 12 is a silicon oxide layer having a thickness from about 0.6 to about 0.8 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternately, the interfacial layer 12 can also be formed by treating the HF-last semiconductor surface in ozonated aqueous solutions, with the ozone concentration usually varying from, but not limited to: 2 parts per million ppm) to 40 ppm.

Next, the high-k gate dielectric 14 is formed on a surface of the interfacial layer 12, if present, or directly on the surface of the semiconductor substrate 10, if the interfacial layer 12 is not present. The term "high-k" denotes an insulator whose dielectric constant is greater than 4.0, typically from about 7.0 or greater. Throughout this application, the dielectric constants mentioned are relative to vacuum. The high-k gate dielectric 14 can be formed by a thermal growth process such as, for example, oxidation, nitridation or oxynitridation. Alternatively, the high-k gate dielectric 14 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The high-k gate dielectric 14 may also be formed utilizing any combination of the above processes.

Illustratively, the high-k gate dielectric 14 employed in the present invention includes, but is not limited to: an oxide, nitride, oxynitride, and/or silicate (including metal silicates and nitrided metal silicates). In one embodiment, it is preferred that the high-k gate dielectric 14 is comprised of an oxide such as, for example, $HfO_2$, $ZrO_2$, $Al_2O_3$, $TiO_2$, $La_2O_3$, $SrTiO_3$, $LaAlO_3$, $Y_2O_3$, $Ga_2O_3$, GdGaO and mixtures thereof. Highly preferred examples of the high-k gate dielectric 14 include $HfO_2$, hafnium silicate or hafnium silicon oxynitride.

The physical thickness of the high-k gate dielectric 14 may vary, but typically, the high-k dielectric 14 has a thickness from about 0.5 to about 10 nm, with a thickness from about 1.0 to about 3 nm being more typical.

Figure 2:
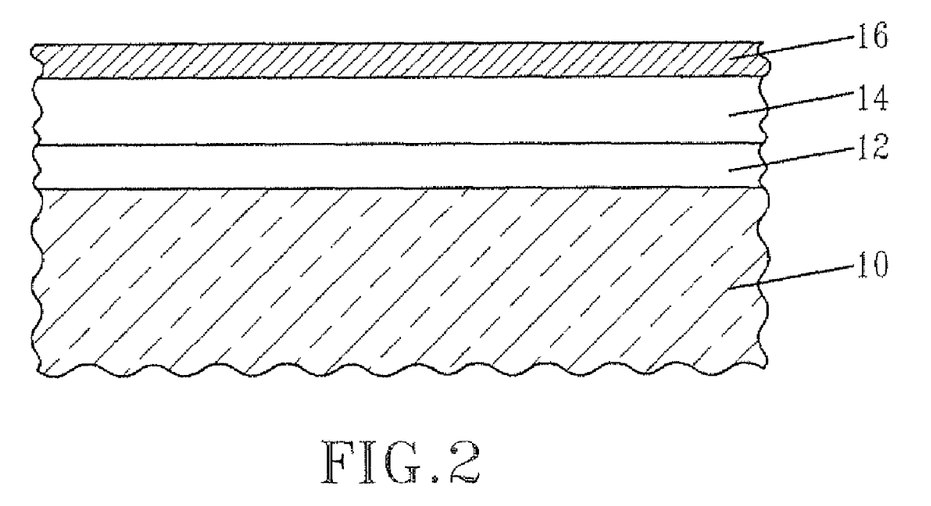

Next, and as shown in FIG. 2, a metal nitrogen-containing layer 16 is formed directly on a surface of the high-k gate dielectric 14. In accordance with the present invention, applicants have determined that gate stacks having low charge trapping and gate current leakage are obtained when the compositional ratio of metal to nitrogen is less than 1.1, with a ratio of metal to nitrogen of less than 1.08 being even more preferred. In an even more preferable embodiment, the compositional ratio of metal to nitrogen in the metal nitrogen-containing layer 16 is less than or equal to 1.03.

Specifically, the metal nitrogen-containing layer 16 includes a metal selected from Group IVB, VB, VIIB or VIIB of the Periodic Table of Elements (using CAS nomenclature). Typically, the metal nitrogen-containing layer 16 includes Ti, V, Zr, Nb, Mo, Hf, Ta, W or Re, with Ti being highly preferred. The physical thickness of the metal nitrogen-containing layer 16 may vary, but typically, the metal nitrogen-containing layer 16 has a thickness from about 0.5 to about 200 mm, with a thickness from about 2 to about 20 nm being more typical.

The metal nitrogen-containing layer 16 having the above mentioned compositional ratio between the metal and nitrogen is formed by a sputtering process which includes first providing a metal target including a metal selected from Group IVB, VB, VIB or VIIB of the Periodic Table of Elements, and an atmosphere that includes argon, Ar, and nitrogen, $N_2$. The compositional ratio of metal to nitrogen in the resultant metal nitrogen-containing layer 16 that is sputtered is controlled by varying the process conditions. For example, the argon/nitrogen flow ratio during sputtering can be used in the present invention to control the ratio of metal and nitrogen in the sputtered metal nitrogen-containing layer 16. In such an embodiment, a metal nitrogen-containing layer 16 having a compositional ratio of metal to nitrogen that is less than 1.1 can be achieved by providing an atmosphere of argon and nitrogen wherein the ratio of argon to nitrogen flow is from about 1.0 to about 0.1. More preferably, a metal nitrogen-containing layer 16 having a compositional ratio of metal to nitrogen that is less than 1.1 can be achieved by providing an atmosphere of argon and nitrogen wherein the ratio of argon to nitrogen flow is about 0.75.

Next, a metal nitrogen-containing film 16 having the above mentioned compositional ratio is sputtered from the metal target utilizing the above-mentioned atmosphere. The sputtering process occurs in a reactor chamber of any conventional sputtering apparatus. Moreover, the metal target used in the present invention includes any solid source of one of the above-mentioned metals.

Figure 3:
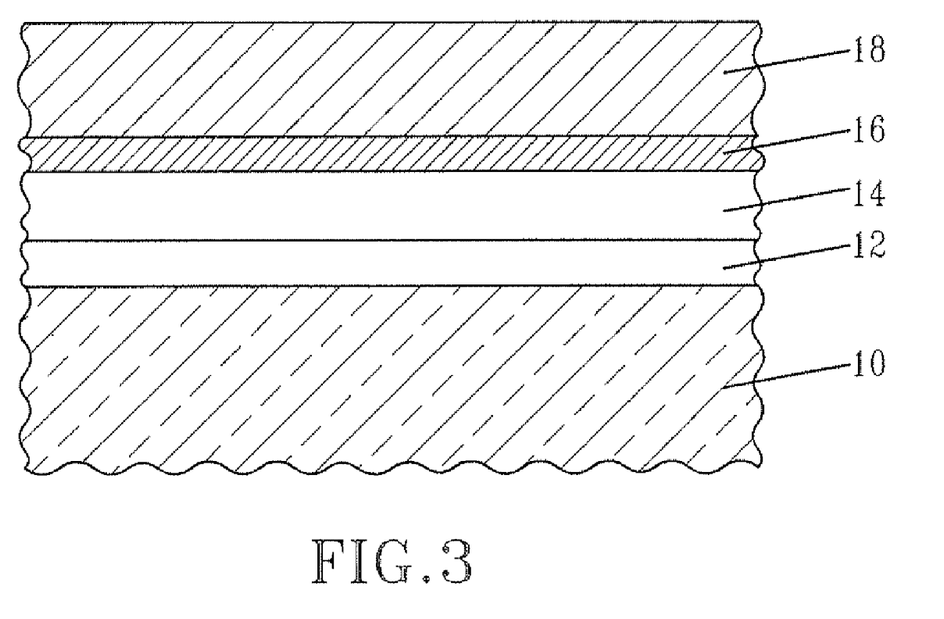

Following the formation of the metal nitrogen-containing layer 16, a Si-containing conductor 18 is formed atop the metal nitrogen-containing layer 16. The resultant structure including the Si-containing conductor 18 is shown in FIG. 3. Specifically, a blanket layer of a Si-containing material is formed on the metal nitrogen-containing layer 16 utilizing a known deposition process such as, for example, physical vapor deposition, CVD or evaporation.

The Si-containing material used in forming the conductor 18 includes Si or a SiGe alloy layer in either single crystal, polycrystalline or amorphous form. Preferably, polycrystalline silicon (i.e., polySi) is employed in the present invention as conductor 18. Combinations of the aforementioned Si-containing materials are also contemplated herein. The blanket layer of Si-containing material may be doped or undoped. If doped, an in-situ doping deposition process may be employed in forming the same. Alternatively, a doped Si-containing layer can be formed by deposition, ion implantation and annealing. The ion implantation and annealing can occur prior to or after a subsequent etching step that patterns the material stack. The doping of the Si-containing layer will shift the workfunction of the gate conductor formed. Illustrative examples of dopant ions for nMOSFETs include elements from Group VA of the Periodic Table of Elements (Group IIIA elements can be used when pMOSFETs are formed).

The thickness, i.e., height, of the Si-containing conductor 18 deposited at this point of the present invention may vary depending on the deposition process employed. Typically, the Si-containing conductor 18 has a vertical thickness from about 20 to about 180 nm, with a thickness from about 40 to about 150 nm being more typical.

Figure 4:
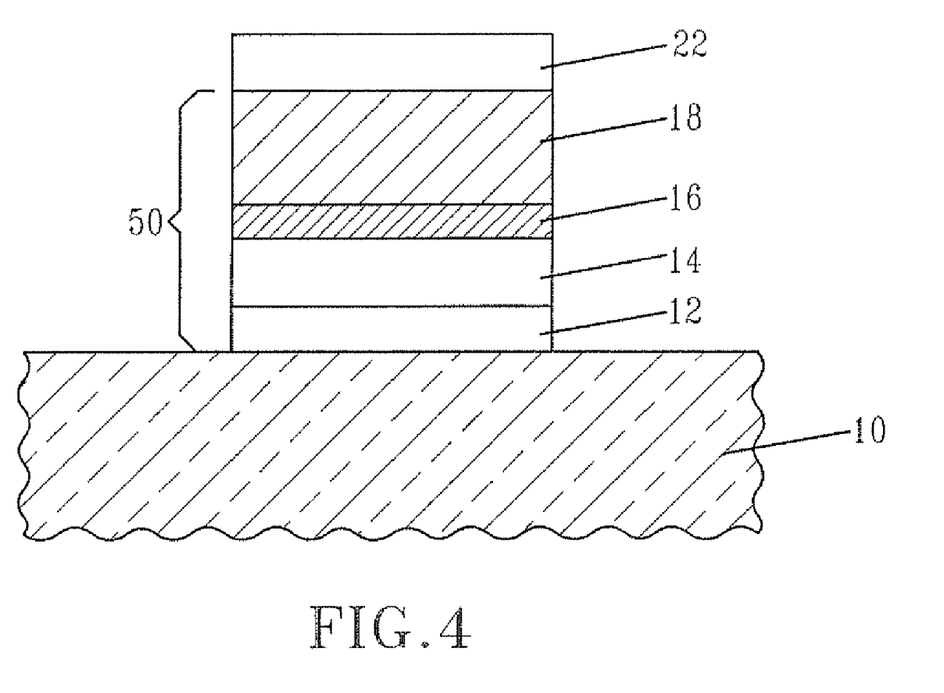

The gate stack structure shown in FIG. 3 is then patterned by lithography and etching. Although a single patterned gate stack 50 is shown in FIG. 4, the present invention contemplates forming a plurality of patterned gate stacks 50. When a plurality of patterned gate stacks are formed, the gate stacks may have the same dimension, i.e., length, or they can have variable dimensions to improve device performance.

FIG. 4 shows a patterned structure including a patterned hard mask 22 located on the surface of Si-containing conductor 18. The patterned hard mask 22 can remain in the final structure or it can be removed utilizing a conventional stripping process that selectively removes the patterned hard mask 20 from the structure. The remaining drawings assume that the patterned hard mask 20 has been removed from the structure so as to provide a platform for subsequent formation of a metal silicide contact atop the Si-containing conductor 18.

The lithographic step employed in the present invention comprises any conventional lithographic patterning process well known to those skilled in the art. For example, the lithographic step includes forming a photoresist or a material stack of a hard mask and a photoresist atop the Si-containing conductor 18. If present, the hard mask comprises an oxide, such as silicon dioxide, or a nitride, such as silicon nitride, while the photoresist comprises any conventional resist material (organic, inorganic or hybrid). When a hard mask is present, the hard mask material is formed by any conventional deposition process including, for example, CVD, PECVD, evaporation, chemical solution deposition and the like. Alternatively, the hard mask can be formed by a thermal process such as, for example, oxidation or nitridation. The photoresist is formed by any conventional deposition process such as, for example, CVD, PECVD, evaporation or spin-on coating.

After forming at least the photoresist on the surface of the Si-containing conductor 18, the photoresist is exposed to a desired pattern of radiation (i.e., a gate conductor pattern) and developed utilizing a conventional resist developer.

The etching step employed in the present invention comprises dry etching, wet etching or any combination thereof. By 'dry etching' is meant one of reactive-ion etching (RIE), ion beam etching, plasma etching and a laser ablation. Wet etching includes a chemical etchant that selectively removes the various materials of the gate stack.

The etching processes employed are typically, but not always, selective to the underlying high-k gate dielectric 14 therefore this etching step does not typically remove the high-k gate dielectric 14 and the interfacial layer 12 from the gate stack. In some embodiments, as shown in FIG. 4, this etching step may, however, be used to remove portions of the high-k gate dielectric 14 and the interfacial layer 12 that are not protected by the material layers of the gate stack that were previously etched.

Figure 5:
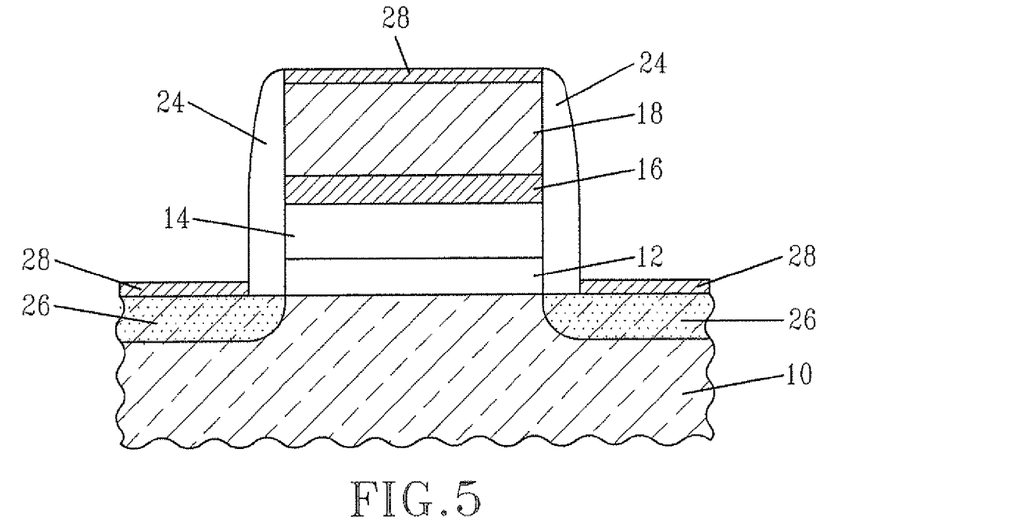

Next, at least one spacer 24 is typically, but not always, formed on exposed sidewalls of each patterned gate region 50, see, for example, FIG. 5. The at least one spacer 24 is comprised of an insulator such as an oxide, nitride, oxynitride and/or any combination thereof. The at least one spacer 24 is formed by deposition and etching. Non-hydrogen containing process should be used in forming the at least one spacer 24.

The width of the at least one spacer 24 must be sufficiently wide such that the source and drain silicide contacts (to be subsequently formed) do not encroach underneath the edges of the gate stack 50. Typically, the source/drain silicide does not encroach underneath the edges of the gate stack 50 when the at least one spacer 24 has a width, as measured at the bottom, from about 20 to about 80 nm.

The gate stack 50 can be optionally passivated prior to spacer formation by subjecting the same to a thermal oxidation, nitridation or oxynitridation process. Passivation should preferably be performed utilizing a non-hydrogen containing process. The passivation step forms a thin layer of passivating material (not shown) about the gate stack 50. This step may be used instead or in conjunction with the previous step of spacer formation. When used with the spacer formation step, spacer formation occurs after the gate region stack 50 passivation process.

Source/drain diffusion regions 26 (with or without the spacers present) are then formed into the substrate. The source/drain diffusion regions 26 are formed utilizing ion implantation and an annealing step. The annealing step serves to activate the dopants that were implanted by the previous implant step. The conditions for the ion implantation and annealing are well known to those skilled in the art. FIG. 5 also shows the presence of the source/drain diffusion regions 26.

The source/drain diffusion regions 26 may also include extension implant regions (not separately labeled) which are formed prior to source/drain implantation using a conventional extension implant. The extension implant may be followed by an activation anneal, or alternatively the dopants implanted during the extension implant and the source/drain implant can be activated using the same activation anneal cycle. Halo implants (not shown) are also contemplated herein. The source/drain extensions are typically shallower than the deep source/drain regions and they include an edge that is aligned with an edge of the patterned gate stack 50.

Next, and if not previously removed, the exposed portion of the high-k gate dielectric 14 and the underlying interfacial layer 12 are removed utilizing a chemical etching process that selectively removes these insulating materials. This etching step stops on an upper surface of the semiconductor substrate 10. Although any chemical etchant may be used in removing the exposed portions of the high-k gate dielectric 14 and the underlying interfacial layer 12, in one embodiment dilute hydrofluoric acid (DHF) is used.

FIG. 5 also shows the presence of silicide contact regions 28 atop the source/drain diffusion regions 26 and the Si-containing conductor 18. The silicide contact regions 28 are formed utilizing any conventional silicidation process.

The silicidation process comprises forming a conductive and refractory metal such as Co, Ti, W, Ni, Pt or alloys thereof with other alloying additives, such as C, Ge, Si, and etc., on top of the area to be silicided. A conventional deposition process, such as CVD, PECVD, sputtering, evaporation or plating, can be used. Optionally, a barrier layer may be formed over the metal layer that protects the metal from oxidation. Examples of optional barrier layers include, for example, SiN, TiN, TaN, TiON and combinations thereof. Following metal deposition the structure is subjected to at least a first anneal that causes reaction between the deposited metal and Si (or other semiconductor material) and subsequent formation of a metal silicide (or more generally on metal semiconductor alloy). The annealing is typically performed at a temperature from about 250° to about 800° C., with a first annealing temperature from about 400° to about 550° C. being more typical.

In some embodiments, the first anneal forms a metal rich silicide phase, which is highly resistant to a selective etch process. When a metal rich phase is produced, a second higher temperature anneal is required to form a low resistivity silicide. In other embodiments, the first anneal is sufficient in forming the low resistivity silicide.

Following the first anneal, the unreacted and remaining portions of the deposited metal are removed using a conventional etch process, such as wet etching, reactive-ion etching (RIE), ion beam etching, or plasma etching.

If needed, a second anneal is performed after the etching process. The second annealing is typically performed at higher temperatures than the first annealing. A typical temperature range for the second, optional, anneal is from about 550° to about 900° C.

It should be noted that the inventive method can be implemented in a replacement gate process as well as the process mentioned above.

Further CMOS processing such as the formation of BEOL (back-end-of-the-line) interconnect levels with metal interconnects can be formed utilizing processing steps that are well known to those skilled in the art.

The following example provides an illustration of the inventive process as well as some advantages that can be obtained from using the same in forming a metal nitrogen-containing layer having a compositional ratio of metal to nitrogen within the above mentioned range in a gate stack.

EXAMPLE

In this example, various polySi/TiN /HfO$_2$/SiO$_2$ stacks were formed on a surface of a Si wafer The SiO$_2$ interfacial layer was formed by oxidation of the Si wafer. The thickness of the SiO$_2$ interfacial layer was about 1 nm. A HfO$_2$ dielectric having a thickness of about 3 nm was then formed on the SiO$_2$ interfacial layer by MOCVD. The TiN layer was then formed by sputtering in an Ar/N$_2$ atmosphere from a Ti target. The sputtering was performed in a long throw system (300 mm separation between the substrate and target) and the argon and nitrogen flow was controlled so as to vary the compositional ratios of titanium and nitrogen. In particular, TiN films were sputtered having a compositional ratio of Ti to nitrogen of about 1.34 (Ar/N$_2$ flow 15/10), 1.0 (Ar/N$_2$ flow 15/20) and 1.03 (Ar to N$_2$ flow 15/30). The polySi was formed by deposition and was doped ex-situ.

Figure 6:
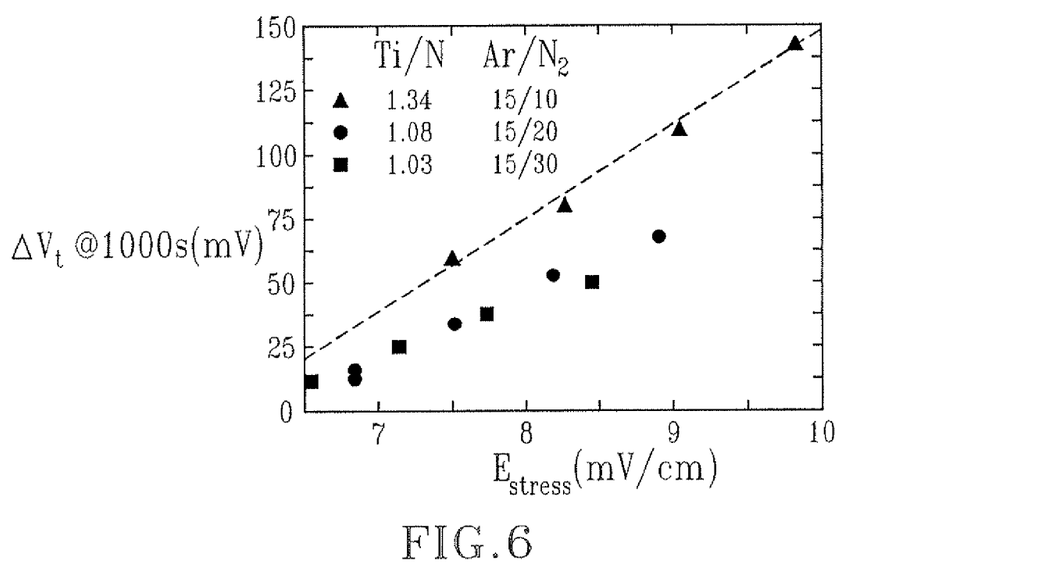
FIG. 6 is a graph of threshold voltage shift vs. stress electric field for oxide/HfO$_x$/TiN nFETs with varying Ti/N compositional ratios.
Figure 7:
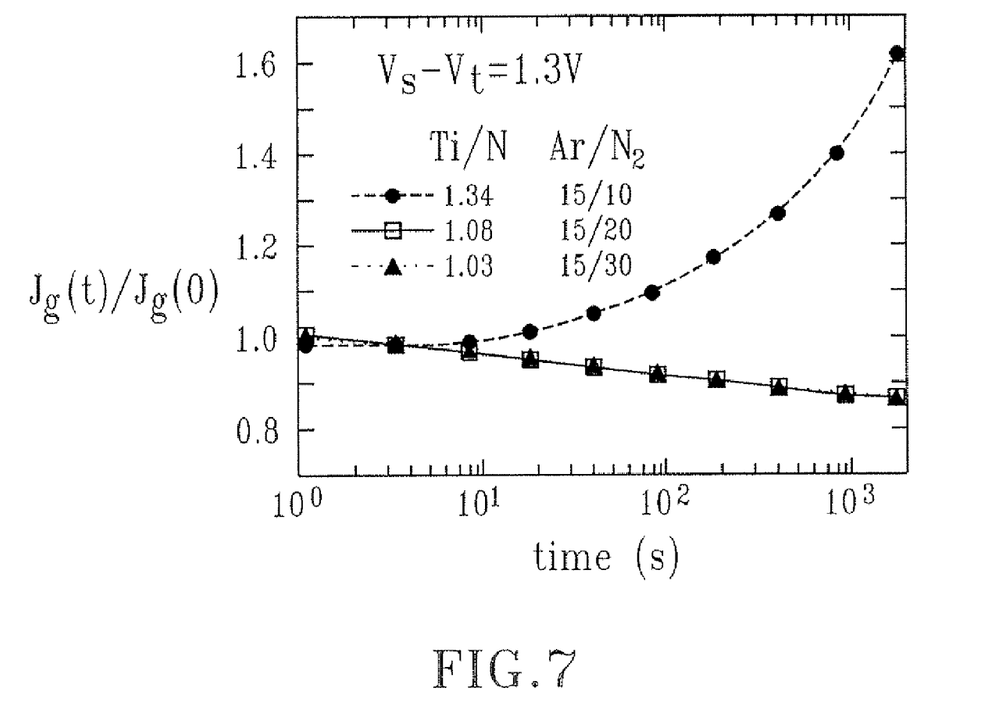
FIG. 7 is a graph of gate leakage current vs. stress time for oxide/HfO$_x$/TiN nFETs with varying Ti/N compositional ratios.

FIG. 6 is a graph of threshold voltage shift vs. stress electric field for the oxide/HfO$_x$/TiN nFETs with varying Ti/N compositional ratios mentioned above. The graph illustrates the dependence of the TiN composition had on charge trapping. As is illustrated, charge trapping induced threshold voltage shift decreased as the compositional ratio of Ti/N decreases; the ratio was determined by RBS (Rutherford Backscattering). FIG. 7 is a graph of gate leakage current vs. stress time for oxide/HfO$_x$/TiN nFETs with varying Ti/N compositional ratios. In this figure, the dependence on TiN composition on gate leakage degradation is illustrated. As is shown, and for high Ti/N ratio, gate leakage started to increase with a stressing time after about 30 seconds of stressing, whereas for lower Ti/N ratio no such increase in gate leakage was observed. Hence, gate leakage degradation was suppressed by decreasing the Ti/N ratio.

In summary, applicants have determined that the compositional ratio of Ti/N impacted both charge trapping and gate dielectric degradation. For a Ti/N ratio of less than 1.1, the reliability of high-k gates stacks was significantly improved.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a multilayered gate stack comprising:
    forming a metal nitrogen-containing layer composed of a metal and nitrogen on a surface of a high-k gate dielectric, said metal nitrogen-containing layer having a compositional ratio of metal to nitrogen of less than 1.1, and said metal is selected from Group IVB, VB, VIB and VIIB of the Periodic Table of Elements; and
    a forming a Si-containing conductor located directly on a surface of said metal nitrogen-containing layer.

2. The method of claim 1 wherein said forming said metal nitrogen-containing layer is by sputtering which includes a step of providing a metal target and an atmosphere including argon and nitrogen.

3. The method of claim 2 wherein said metal target comprises Ti.

4. The method of claim 1 wherein said compositional ratio is obtained by varying a flow ratio between argon and nitrogen, said argon and nitrogen forming a sputtering atmosphere.

5. The method of claim 4 wherein said flow ratio between argon and nitrogen is from about 1.0 to 0.1.

6. The method of claim 5 wherein said flow ratio between argon and nitrogen is 0.75.

* * * * *